United States Patent
Manipatruni et al.

(10) Patent No.: US 10,347,830 B2
(45) Date of Patent: Jul. 9, 2019

(54) NON-VOLATILE REGISTER FILE INCLUDING MEMORY CELLS HAVING CONDUCTIVE OXIDE MEMORY ELEMENT

(71) Applicant: Intel Corporation, Santa Clara, CA (US)

(72) Inventors: Sasikanth Manipatruni, Hillsboro, OR (US); Elijah Ilya Karpov, Santa Clara, CA (US); Brian Doyle, Portland, OR (US); Dmitri E. Nikonov, San Jose, CA (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/046,189

(22) Filed: Jul. 26, 2018

(65) Prior Publication Data

US 2018/0331281 A1 Nov. 15, 2018

Related U.S. Application Data

(62) Division of application No. 14/546,061, filed on Nov. 18, 2014, now Pat. No. 10,043,971.

(51) Int. Cl.
*H01L 45/00* (2006.01)
*G06F 12/02* (2006.01)
(Continued)

(52) U.S. Cl.
CPC .......... *H01L 45/00* (2013.01); *G06F 12/0246* (2013.01); *G11C 8/16* (2013.01);
(Continued)

(58) Field of Classification Search
CPC . H01L 45/00; H01L 27/2463; H01L 27/2436; H01L 45/146; H01L 45/1233;
(Continued)

(56) References Cited

U.S. PATENT DOCUMENTS 10,043,971 B2    8/2018   Manipatruni et al.
2008/0192529 A1  8/2008   Hoenigschmid et al.
(Continued)

OTHER PUBLICATIONS

"U.S. Appl. No. 14/546,061, Non Final Office Action dated Oct. 20, 2017", 11 pgs.
(Continued)

*Primary Examiner* — Ajay Ojha
(74) *Attorney, Agent, or Firm* — Schwegman Lundberg & Woessner, P.A.

(57) ABSTRACT

Some embodiments include apparatuses and methods having a memory element included in a non-volatile memory cell, a transistor, an access line coupled to a gate to the transistor, a first conductive line, and a second conductive line. The memory element can include a conductive oxide material located over a substrate and between the first and second conductive lines. The memory element includes a portion coupled to a drain of the transistor and another portion coupled to the second conductive line. The first conductive line is coupled to a source of the transistor and can be located between the access line and the memory element. The access line has a length extending in a first direction and can be located between the substrate and the memory element. The first and second conductive lines have lengths extending in a second direction.

20 Claims, 11 Drawing Sheets

(51) Int. Cl.
  *G11C 14/00* (2006.01)
  *G11C 11/16* (2006.01)
  *G11C 8/16* (2006.01)
  *G11C 11/00* (2006.01)
  *G11C 13/00* (2006.01)
  *H01L 27/02* (2006.01)
  *H01L 27/24* (2006.01)

(52) U.S. Cl.
  CPC ............ *G11C 11/005* (2013.01); *G11C 11/16* (2013.01); *G11C 13/0007* (2013.01); *G11C 13/0026* (2013.01); *G11C 14/0018* (2013.01); *H01L 27/0207* (2013.01); *H01L 27/2436* (2013.01); *H01L 27/2463* (2013.01); *H01L 45/04* (2013.01); *H01L 45/1233* (2013.01); *H01L 45/146* (2013.01); *G06F 2212/7201* (2013.01); *G11C 2213/74* (2013.01); *G11C 2213/79* (2013.01)

(58) Field of Classification Search
  CPC ..... H01L 45/04; H01L 27/0207; G11C 11/16; G11C 11/005; G11C 8/16; G11C 13/0026; G11C 13/0007; G11C 14/0018; G11C 2213/79; G11C 2213/74; G06F 12/0246; G06F 2212/7201
  See application file for complete search history.

(56) References Cited

U.S. PATENT DOCUMENTS

| | | |
|---|---|---|
| 2010/0091548 A1 | 4/2010 | Reed et al. |
| 2013/0163319 A1 | 6/2013 | Rao et al. |
| 2014/0024197 A1 | 1/2014 | Kawashima et al. |
| 2016/0141031 A1 | 5/2016 | Manipatruni et al. |
| 2016/0181319 A1 | 6/2016 | Tanaka et al. |

OTHER PUBLICATIONS

"U.S. Appl. No. 14/546,061, Notice of Allowance dated Apr. 4, 2018", 10 pgs.
"U.S. Appl. No. 14/546,061, Response filed Jan. 22, 2018 to Non Final Office Action dated Oct. 20, 2017", 11 pgs.
"U.S. Appl. No. 14/546,061, Response filed Jul. 19, 2017 to Restriction Requirement dated May 19, 2017", 8 pgs.
"U.S. Appl. No. 14/546,061, Restriction Requirement dated May 19, 2017", 9 pgs.
Brain, R., "A 22nm high performance embedded DRAM SoC technology featuring tri-gate transistors and MIMCAP COB", VLSI Technology (VLSIT), Kyoto, (Jun. 2013), T16-T17.

202

202

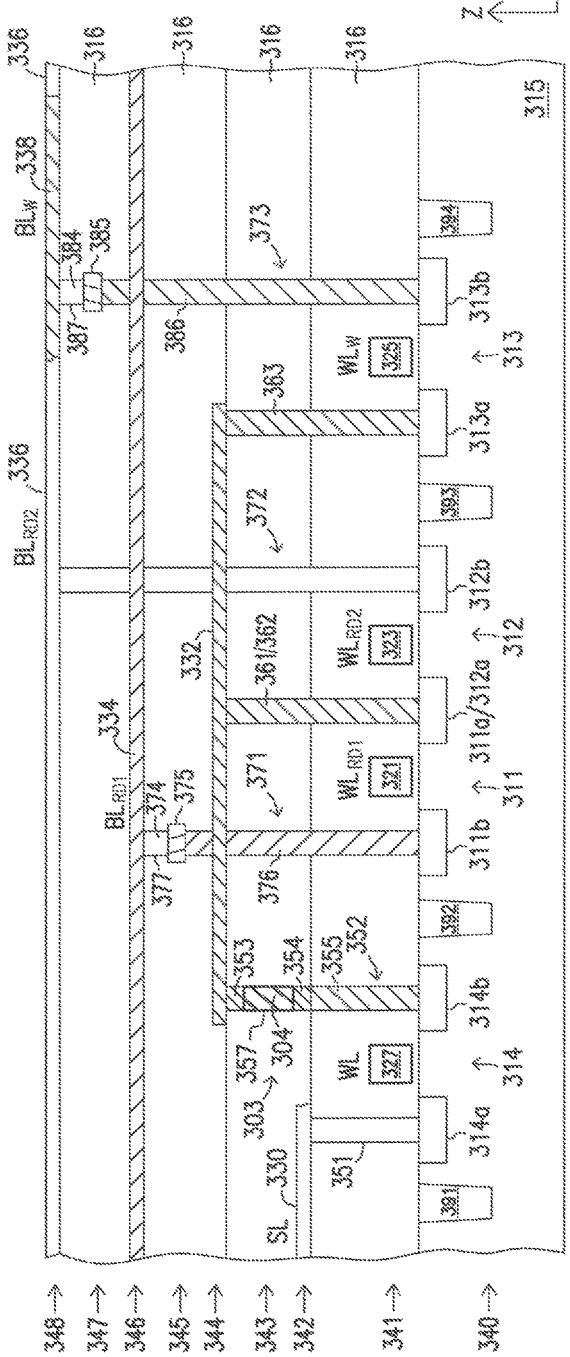
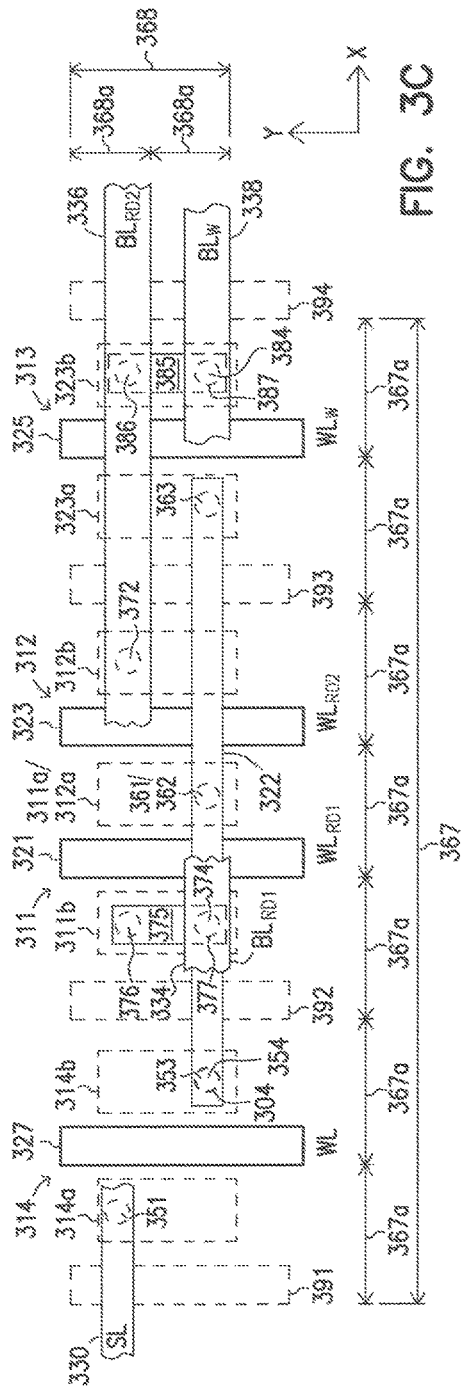
FIG. 3B
FIG. 3C

NON-VOLATILE REGISTER FILE INCLUDING MEMORY CELLS HAVING CONDUCTIVE OXIDE MEMORY ELEMENT

PRIORITY

This Application is a divisional of U.S. patent application Ser. No. 14/546,061, filed Nov. 18, 2014, which is incorporated by reference herein in its entirety.

BACKGROUND

Many electronic systems, such as computers and mobile devices, usually include a processor (or a controller) to control operations of the device or system. In some operations, the processor may store information in a volatile register file, such as a static random access memory (SRAM) register file. In some conventional techniques, storing information in such a volatile register file may reduce efficiency in certain operational states of the processor. Moreover, the size of some conventional register files may be unsuitable to be incorporated in some processors.

BRIEF DESCRIPTION OF THE DRAWINGS

FIG. 3B shows a side view of a structure of the portion of the register file of FIG. 3A, according to some embodiments described herein.

FIG. 3C shows a top view of the structure of the portion of the register file of FIG. 3B, according to some embodiments described herein.

DETAILED DESCRIPTION

Figure 1:
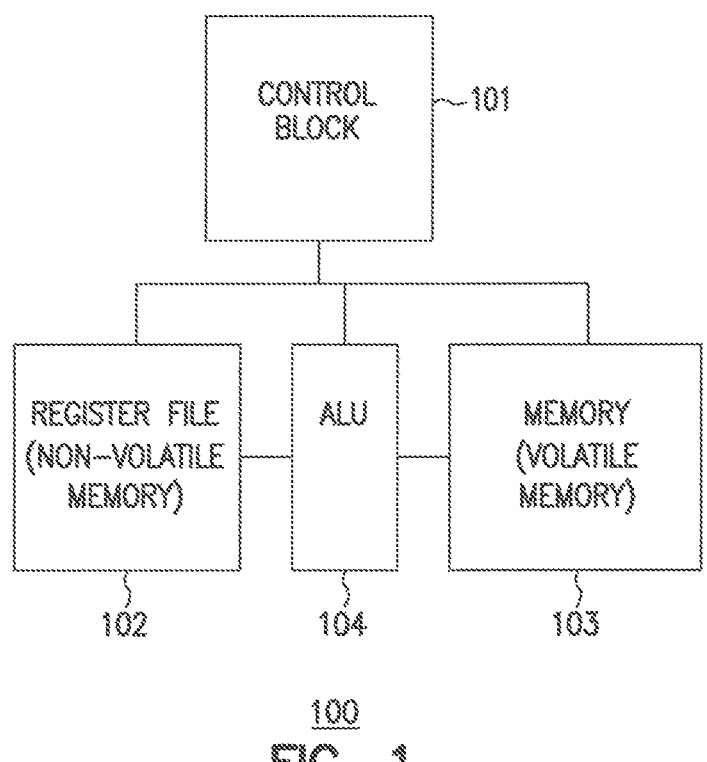
FIG. 1 shows a block diagram of an apparatus in the form of a processor, according to some embodiments described herein.

FIG. 1 shows a block diagram of an apparatus in the form of a processor 100, according to some embodiments described herein. Processor 100 can include a general-purpose processor or an application specific integrated circuit (ASIC). Processor 100 can be part of (e.g., included in) an electronic device or system, such as a computer (e.g., desktop or notebook computer), a tablet, a cellular telephone, and other electronic devices or systems.

As shown in FIG. 1, processor 100 can include a control block 101, a register file 102, a memory 103, and an arithmetic logic unit (ALU) 104. One skilled in the art would recognize that a processor such as processor 100 includes many additional components, several of which are not shown in FIG. 1 so as not to obscure the embodiments described herein.

Control block 101 can be arranged (e.g., configured) to control operations of processor 100. For example, control block 101 may include logic circuitry (e.g., control logic and instruction decoders) and other components to control operations of processor 100.

Register file 102 can include non-volatile memory cells that can be arranged (e.g., configured) to store information (e.g., data, instruction codes, and other information). Memory 103 can include volatile memory cells (e.g., dynamic random access memory DRAM cells, SRAM cells, or both DRAM and SRAM cells).

Processor 100 can be included in a chip (e.g., a semiconductor die). Thus, control block 101, register file 102, ALU 104, and memory 103 can be located on (e.g., formed on or formed in) the same chip (e.g., the same semiconductor die). In an alternative arrangement, memory 103 can be omitted from processor 100. In such an alternative arrangement, memory 103 can be located in another chip separated from the chip that includes processor 100.

In the arrangement of FIG. 1, since register file 102 can be located inside processor 100 (e.g., located in the core of processor 100), register file 102 can be considered as an embedded non-volatile memory of processor 100. Embedding register file 102 on the same chip with other components (e.g., control block 101 and ALU 104) of processor 100 may improve operations (e.g., power management) of processor 100. For example, processor 100 may include a number of operating states including idle states. Register file 102 may store information associated with one or more operating states of processor 100. Embedding register file 102 on the same chip with other components of processor 100 may allow processor 100 to efficiently perform some operating states, such as idle states. This may reduce power consumption in processor 100. This may also extend battery life of a device or system that includes processor 100.

Register file 102 can include structures and perform operations of the register files described below with reference to FIG. 2A through FIG. 9.

Figure 2A:
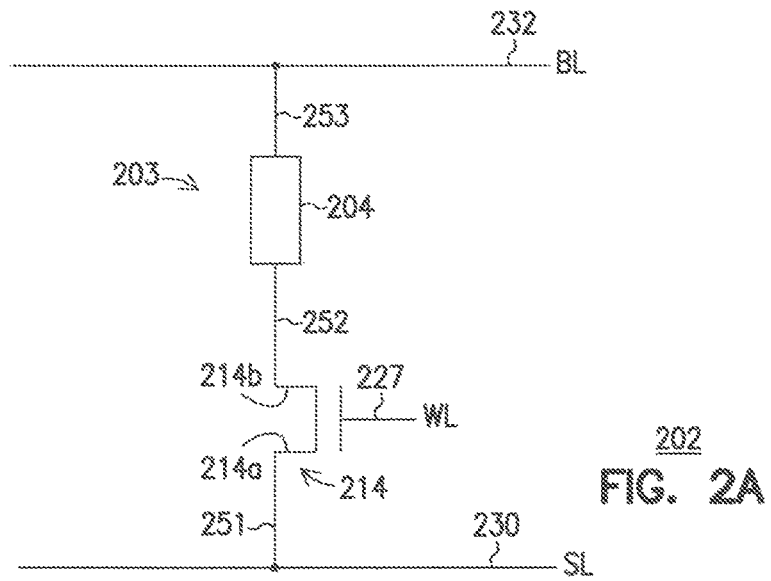
FIG. 2A shows a schematic diagram of a portion of a register file including a non-volatile memory cell, according to some embodiments described herein.

FIG. 2A shows a schematic diagram of a portion of a register file 202 including a memory cell 203, according to some embodiments described herein. Register file 202 can correspond to register file 102 of FIG. 1. As shown in FIG. 2A, memory cell 203 in FIG. 2A can include a memory element 204 that can be arranged (e.g., configured) to store information. Memory cell 203 is a non-volatile memory cell, such that information stored in memory element 204 can be retained when no supply power is provided to register file 202.

Memory cell 203 can include transistor (e.g., select transistor) 214 to allow access to memory element 204. Transistor 214 can include a source 214a, a drain 214b, and a gate that can be part of an access line (e.g., word line) 227. In this description, source and drain are used interchangeably. Transistor 214 and memory element 204 can be coupled in series between a select line 230 and a data line (e.g., bit line) 232. Select line 230 can conduct a signal (e.g., select line signal) SL. Data line 232 can conduct a signal (e.g., bit line signal) BL.

Register file 202 can include a connection 251 coupled to source 214a and select line 230, a connection 252 coupled to one portion (e.g., one end) of memory element 204 and drain 214b, and a connection 253 coupled to another portion (e.g., another end) of memory element 204 and data line 232.

Transistor 214 can be controlled (e.g., turned on or off) by a signal (e.g., word line signal) WL. For example, during write and read operations, transistor 214 can be turned on to form a conductive path between data line 232 and select line 230 through memory element 204. A conductive channel between source 214a and drain 214b of transistor 214 can form part of that conductive path. A write operation can store (e.g., write) information in memory element 204. A read operation can retrieve (e.g., read) information from memory element 204.

A write operation can be performed in register file 202 to cause memory element 204 to have different conductive states. For example, during a write operation, applying a higher voltage (e.g., a positive voltage) on data line 232 with respect to a voltage applied to select line 230 may cause the material of memory element 204 to be more conductive (e.g., to allow more current to flow through memory element 204). During another write operation, applying a lower voltage (e.g., a negative voltage) on data line 232 with respect to a voltage applied to select line 230 may cause the material of memory element 204 to be less conductive (e.g., to allow less current to flow through memory element 204). The value of information stored in memory element 204 can be based on the conductive state of memory element 204. For example, the stored information can have one value (e.g., logic zero) if memory element 204 is in one conductive state (e.g., more conductive) and another value if memory element 204 is in another conductive state (e.g., less conductive).

In a read operation, appropriate voltages (e.g., read voltages) can be applied to data line 232 and select line 230 to cause a current (e.g., read current) to flow in the conductive path between data line 232 and select line 230 through memory element 204. Different conductive states of memory element 204 can cause the current to have different values in a read operation. The current (or voltage) can be measured (e.g., by a read circuit of register file 202, not shown in FIG. 2A) to determine the value of information retrieved from memory element 204. The voltages applied to select line 230 and data line 232 during a read operation can be selected such that the conductive state of memory element 204 remains unchanged before and after the read operation. This allows the value of the stored information in memory element 204 to remain unchanged.

Memory element 204 can include a material that can be configured to allow memory element 204 to have different conductive states based on voltages across memory element 204. Example materials for memory element 204 include conductive oxide materials. Such conductive oxide materials may allow an amount of current (e.g., a detectable current that can be sensed by a read circuit of register file 202) to flow through memory element 204 during a read operation. Some examples for conductive oxide materials that may be used for memory element 204 include indium tin oxide (ITO) such as $(In_2O_3)_x(SnO_2)_{1-x}$; metal, carbon, antimony-doped binary oxides such as SnOx: Sb; and metal, carbon, antimony-doped binary oxides binary oxide alloys such as $(Y_2O_3)_x(ZrO_2)_{1-x}$. These materials can be either conductive out of plane when deposited as a thin films (e.g., a film has thickness in a range from 2 nm to 10 nm) or conductive in the bulk form.

Figure 2B:
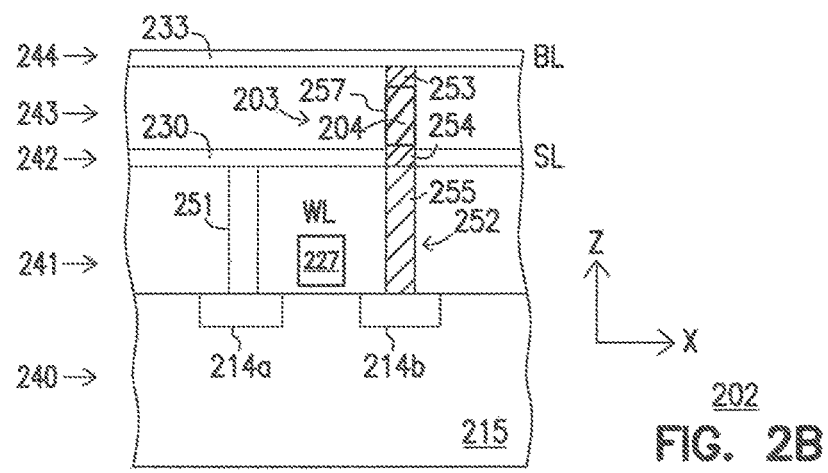
FIG. 2B shows a side view of a structure of the portion of the register file of FIG. 2A, according to some embodiments described herein.

FIG. 2B shows a side view of a structure of the portion of register file 202 of FIG. 2A, according to some embodiments described herein. As shown in FIG. 2B, register file 202 can include a substrate 215 and different levels (physical elevations) 240 through 244 arranged in a direction (e.g., Z-direction) perpendicular to substrate 215 (e.g., arranged in a vertical direction over substrate 215). Select line 230 and data line 232 can be located in different levels and can extend in an X-direction, which is perpendicular to the Z-direction. For example, select line 230 can be located on level 242. Data line 232 can be located on level 244.

Memory element 204 can be located on level 243, which is between levels 242 and 244. Register file 202 can include a via 257 located on level 243. Memory element 204 can be located inside via 257, such that the material of memory element 204 can either partially fill via 257 or completely fill via 257. In an alternative arrangement (e.g., shown in FIG. 2D), memory element 204 can be located on level 243 but outside via 257.

As shown in FIG. 2B, connection 251 can include a conductive segment (e.g., vertical conductive segment) coupled between select line 230 and source 214a. Connection 252 can include a combination of conductive segments (e.g., vertical conductive segments) 254 and 255 coupled between memory element 204 and drain 214b. Connection 253 can include a conductive segment (e.g., vertical conductive segment) coupled between data line 232 and memory element 204. The conductive segments of connections 251, 252, and 253 can include the same conductive material or different conductive materials. Example materials for these conductive segments include conductive polysilicon, metals, or other conductive materials.

FIG. 2B shows an example where transistor 214 has a planar structure. Alternatively, transistor 214 can have another structure, such as a tri-gate transistor structure, a gate all around transistor structure, or other structures.

Memory element 204 may include multiple layers (not shown) of materials, such that one of the multiple layers can include a memory material layer (e.g., conductive oxide layer) configured to store information. The other layers of such multiple layers of memory element 204 may include materials configured to be electrode layers (e.g., top and bottom electrode layers) that sandwich the memory material layer.

Figure 2C:
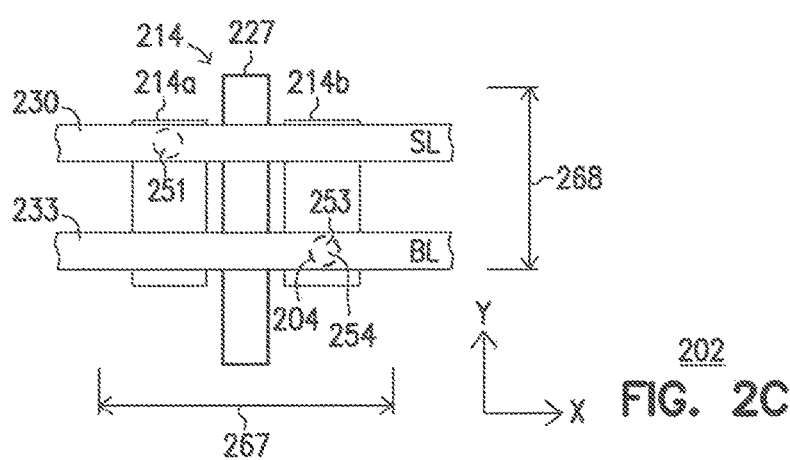
FIG. 2C shows a top view of the structure of the portion of the register file of FIG. 2B, according to some embodiments described herein.

FIG. 2C shows a top view of a structure of the register file 202 of FIG. 2B, according to some embodiments described herein. As shown in FIG. 2C, access line 227 can extend in a Y-direction, which is perpendicular to the X-direction.

Memory cell 203 can have a footprint defined by dimensions 267 and 268. Dimension 267 can have a value based on a value of a line pitch of access line 227 in the X-direction. Dimension 268 can have a value based on a value of the width (in the Y-direction) of select line 230 and data line 232. In some arrangements, dimensions 267 and 268 can have values of 100 nm (nanometer) and 81 nm, respectively.

Figure 2D:
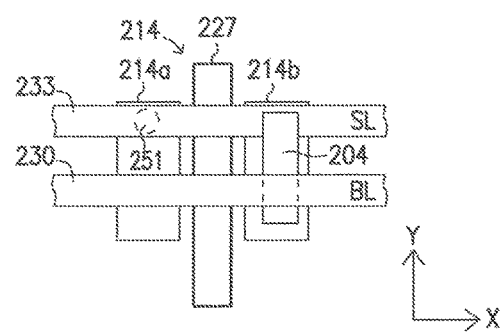
FIG. 2D shows a top view of a structure of the register file of FIG. 2C including an alternative arrangement of a memory element, according to some embodiments described herein.

FIG. 2D shows a top view of a structure of the register file 202 of FIG. 2C including an alternative arrangement of memory element 204, according to some embodiments described herein. As described above with reference to FIG. 2B and FIG. 2C, memory element 204 can be located inside a via (e.g., via 257). In the alternative arrangement shown in FIG. 2D, memory element 204 can be located outside a via. For example, in the arrangement shown in FIG. 2D, memory element 204 can having a length extending in the Y-direction, such that the footprint of memory element 204 may overlap select line 230.

Figure 2E:
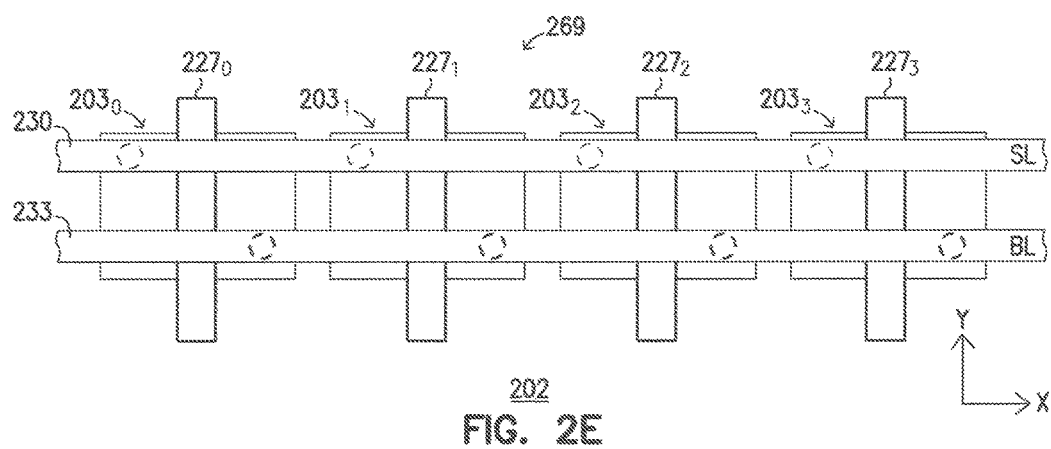
FIG. 2E shows a top view of a structure of a memory array of the register file of FIG. 2A, according to some embodiments described herein.

FIG. 2E shows a top view of a structure of a memory array 269 of register file 202, according to some embodiments described herein. Memory array 269 can include multiple memory cells $203_0$, $203_1$, $203_2$, and $203_3$. For simplicity, FIG. 2E shows memory array 269 having only four memory cells. The number of memory cells can vary. Each of memory cells $203_0$, $203_1$, $203_2$, and $203_3$ can include memory cell 203 described above with respect to FIG. 2A through FIG. 2D. As shown in FIG. 2E, select line 230 and data line 232 can extend across memory cells $203_0$, $203_1$, $203_2$, and $203_3$ in the X-direction, such that select line 230 and data line 232 can be shared by memory cells $203_0$, $203_1$, $203_2$, and $203_3$.

Register file 202 of FIG. 2E can include access lines (e.g., word lines) $227_0$, $227_1$, $227_2$, and $227_3$ extending in the Y-direction. Each of access lines $227_0$, $227_1$, $227_2$, and $227_3$ can correspond to access line 227 of FIG. 2A through FIG. 2D. In FIG. 2E, register file 202 can use access lines $227_0$, $227_1$, $227_2$, and $227_3$ to selectively control transistors (not shown in FIG. 2E) in corresponding memory cells $203_0$, $203_1$, $203_2$, and $203_3$.

Figure 3A:
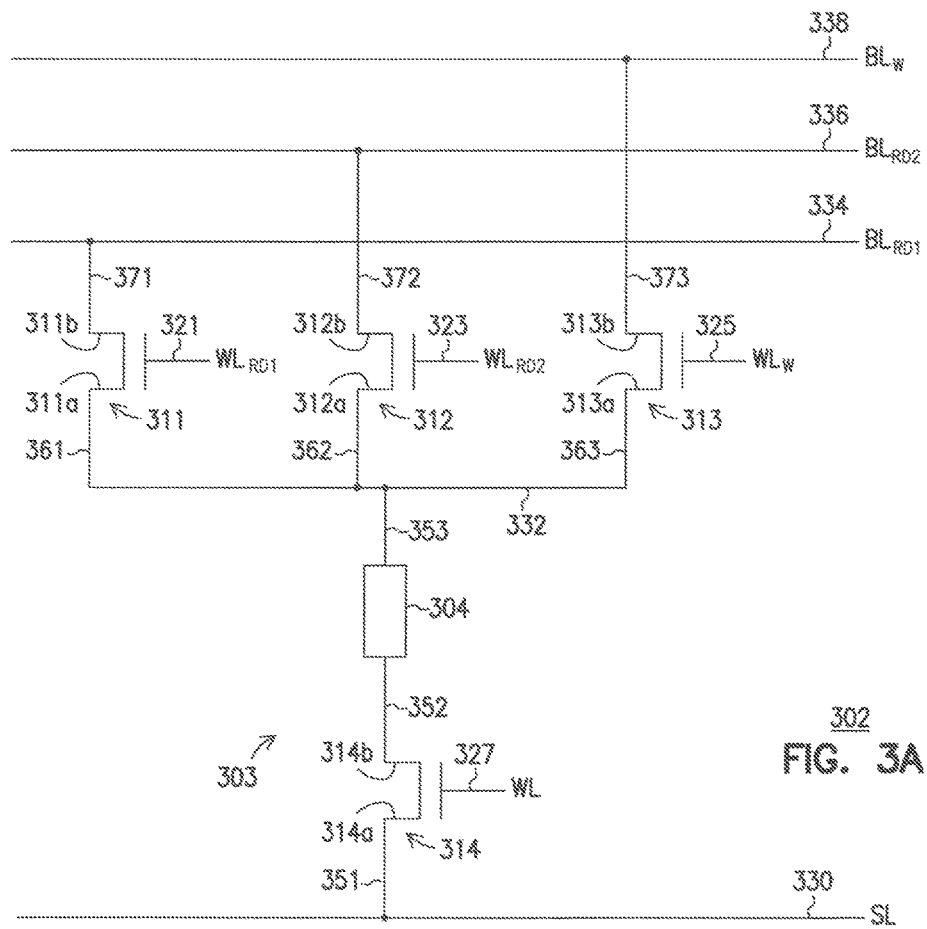
FIG. 3A shows a schematic diagram of a portion of a register file including a non-volatile memory cell having multiple input/output ports (e.g., multiple read/write ports), according to some embodiments described herein.

FIG. 3A shows a schematic diagram of a portion of a register file 302 including a non-volatile memory cell 303 having multiple input/output ports (e.g., multiple read/write ports), according to some embodiments described herein. Register file 302 can correspond to register file 102 of processor 100 of FIG. 1. Memory cell 303 in FIG. 3A can include a memory element and a transistor (e.g., select transistor) similar to, or identical to, those of memory cell 203 of FIG. 2A. For example, as shown in FIG. 3A, memory cell 303 can include a memory element 304, and a transistor 314 having a source 314a, a drain 314b, and a gate that can be part of an access line 327. Source 314a can be coupled to a select line 330 through a connection 351. Drain 314b can be coupled to one portion (e.g., one end) of memory element 304 through a connection 352. Another portion (e.g., another end) of memory element 304 can be coupled to a line (e.g., metal line) 332 through a connection 353. Transistor 314 can be turned on during a write operation to store (e.g., write) information in memory element 304 and during a read operation to retrieve (e.g., read) information from memory element 304.

Register file 302 can include transistors 311, 312, 313 that can be controlled (e.g., turned on or off) by signals (e.g., word line signals) $WL_{RD1}$, $WL_{RD2}$, and $WL_W$, respectively, on corresponding access lines (e.g., word lines) 321, 323, 325, and 327. Transistor 311 can include a source 311a coupled to line 332 through a connection 361, a drain 311b coupled to a data line (e.g., bit line) 334 through a connection 371, and a gate that can be part of access line 321. Transistor 312 can include a source 312a coupled to line 332 through a connection 362, a drain 312b coupled to a data line (e.g., bit line) 336 through a connection 372, and a gate that can be part of access line 323. Transistor 313 can include a source 313a coupled to line 332 through a connection 363, a drain 313b coupled to a data line (e.g., bit line) 338 through a connection 373, and a gate that can be part of access line 325.

Data lines 334, 336, and 338 can conduct corresponding signals (e.g., bit line signals) $BL_{RD1}$, $BL_{RD2}$, and $BL_W$. Data line 338 can be coupled to a write circuit (e.g., a write port), not shown in FIG. 3A, that can operate during a write operation to store information in memory element 304. Data line 334 can be coupled to a read circuit (e.g., a read port), not shown in FIG. 3A, that can operate during a read operation to retrieve information from memory element 304. Data line 336 can be coupled to another read circuit (e.g., another read port), not shown in FIG. 3A, that can operate during a read operation to retrieve information from memory element 304. The combination of memory element 304 and transistors 311, 312, 313, and 314 allows memory cell 303 to operate as a non-volatile memory cell having multiple input/output ports (e.g., a write port and multiple read ports in the example of FIG. 3A).

During a write operation, transistors 313 and 314 can be turned on. A voltage (e.g., write voltage) can be applied to data line 338 (associated with signal $BL_W$), and another voltage can be applied to select line 330 (associated with signal SL). This may form a conductive path (e.g., current path) between data line 338 and select line 330 through a series combination of transistor 313, memory element 304, and transistor 314, in which each of transistors 313 and 314 can form part of the conductive path. Memory element 304 may change from one conductive state to another conductive state that corresponds to the value of information to be stored in memory element 304. The values of the voltages (that cause memory element 304 to have a particular conductive state) applied to select line 330 and data line 338 can be selected based on the value of information provided by a write circuit (e.g., not shown in FIG. 3A) coupled to data line 338 during a write operation.

During a read operation associated with a read circuit (not shown in FIG. 3A) coupled to data line 334 (associated with signal $BL_{RD1}$), transistors 311 and 314 can be turned on. A voltage (e.g., read voltage) can be applied to data line 334 (associated with signal $BL_{RD1}$), and another voltage can be applied to select line 330. This may form a conductive path (e.g., current path) between data line 334 and select line 330 through a series combination of transistor 311, memory element 304, and transistor 314, in which each of transistors 311 and 314 can be part of the conductive path. The value of information retrieved from memory element 304 can be determined by measuring the value of current (or voltage) on data line 334. The voltages applied to data line 334 and select line 330 can be selected such that the conductive state of memory element 304 (e.g., the value of stored information in memory element 304) remains unchanged before and after the read operation.

A read operation associated with another read circuit (not shown in FIG. 3A) coupled to data line 336 (associated with signal $BL_{RD2}$) can be similar to that of the above read operation associated with a read circuit coupled to data line 334. For example, during a read operation associated with a read circuit coupled to data line 336, transistors 312 and 314 can be turned on. A voltage (e.g., read voltage) can be applied to data line 336, and another voltage can be applied to select line 330. This may form a conductive path (e.g., current path) between data line 336 and select line 330 through a series combination of transistor 312, memory element 304, and transistor 314, in which each of transistors 312 and 314 can be part of the conductive path. The value of information retrieved from memory element 304 can be determined by measuring the value of current (or voltage) on data line 336. The voltages applied to data line 336 and select line 330 can be selected such that the conductive state of memory element 304 (e.g., the value of stored information in memory element 304) remains unchanged before and after the read operation.

A write operation and a read operation described above can be performed at different times. However, read operations from different read circuits associated with data lines 334 and 336 can be either performed at different times or performed concurrently (e.g., simultaneously). For example, different read circuits coupled to data lines 334 and 336 can concurrently access memory element 304 to retrieve (e.g., concurrently retrieve) information from memory element 304.

FIG. 3A shows an example of register file 302 that includes three transistors 311, 312, and 313 to allow memory cell 303 to operate with one input port (e.g., one write port) associated with data line 338, and two output ports (e.g., two read ports) associated with data lines 334 and 336. However, the number of input port (or input ports), output port (or output ports), or both can vary. For example, in FIG. 3A, at least one additional transistor and at least one additional data line (similar to transistor 313 and data line 338) can be included in register file 302 and coupled to memory element 304 to add at least one more input port (e.g., write port) to memory cell 303. In another example, at least one additional transistor and at least one additional data line (similar to transistor 311 or 312 and data line 334 or 336) can be included in register file 302 and coupled to memory element 304 to add at least one more output port (e.g., read port) to memory cell 303.

FIG. 3B and FIG. 3C show a side view and a top view, respectively, of a structure of the portion of register file 302 of FIG. 3A, according to some embodiments described herein. For ease of viewing FIG. 3B and FIG. 3C, some portions of register file 302 are partially shown and some other portions of register file 302 are shown with partial hatch patterns.

As shown in FIG. 3B, register file 302 can include a substrate 315 and different device levels (physical elevations) 340 through 348 arranged in a direction (e.g., Z-direction) perpendicular to substrate 315 (e.g., in a vertical direction over substrate 315). Substrate 315 can include a semiconductor (e.g., silicon) substrate. A number of dielectric materials 316 can be formed over substrate 315. As shown in FIG. 3C, data lines 334, 336, 338, and select line 330 can extend in an X-direction. Access lines 321, 323, 325, and 327 can extend in a Y-direction, which is perpendicular to the X-direction.

Register file 302 can include structures (e.g., shallow trench isolations (STI)) 391, 392, 393, and 394 located in substrate 315. Sources 311a, 312a, 313a, and 314a, and drains 311b, 312b, 313b, and 314b can be doped regions located in substrate 315. FIG. 3B shows an example where transistors 311, 312, 313, and 314 have a planar structure. Alternatively, transistors 311, 312, 313, and 314 can have another structure, such as a tri-gate transistor structure, a gate all around transistor structure, or other structures.

As shown in FIG. 3B, access lines 321, 323, 325, and 327 (associated with signals $WL_{RD1}$, $WL_{RD2}$, $WL_W$, and WL, respectively) can be located on level 341. Select line 330 can be located on level 342. Line 332 can be located on level 344 and can extend in the X-direction. In an alternative arrangement, select line 330 and line 332 can be located on the same level (e.g., on level 344). Sources 311a, 312a, and 313a can be coupled together by line 332.

Data lines 334 (associated with signal $BL_{RD1}$) can be located on level 346. Data lines 336 and 338 (associated with signals $BL_{RD2}$ and $BL_W$, respectively) can be located on the same level, such as level 348. Data lines 334, 336, and 338, select line 330, and line 332 can include conductive lines (e.g., metal lines).

Memory element 304 can be located on level 343, which is between level 342 (where select line 330 is located) and level 344 (where line 332 is located). Memory element 304 can be inside a via 357, such that the material of memory element 304 can either partially fill via 357 or completely fill via 357. In an alternative arrangement, memory element 304 can be located outside via 357.

Connection 351 can include a conductive segment (e.g., vertical conductive segment) coupled between select line 330 and source 314a. Connection 352 can include a combination of conductive segments (e.g., vertical conductive segments) 354 and 355 coupled between memory element 304 and drain 314b. Connection 353 can include a conductive segment (e.g., vertical conductive segment) coupled between line 332 and memory element 304.

As shown in FIG. 3B, source 311a of transistor 311 and source 312a of transistor 312 can share the same region (e.g., doped region) in substrate 315. Thus, connections 361 and 362 can include the same conductive segment (e.g., vertical conductive segment) coupled between line 332 and the same region (e.g., doped region) in substrate 315. Connection 363 can include a conductive segment (e.g., vertical conductive segment) coupled between line 332 and source 313a.

As shown in FIG. 3B and FIG. 3C, connection 371 can include a combination of a conductive segment 374, a line (e.g., metal line) 375 extending in the Y-direction, and a conductive segment 376. At least a portion of conductive segment 374 can be inside a via 377 between levels 344 and 346.

Connection 372 can include a conductive segment (e.g., vertical conductive segment) coupled between data line 336 and drain 312b.

Connection 373 can include a combination of a conductive segment 384, a line 385 (extending in the Y-direction), and a conductive segment 386. At least a portion of conductive segment 384 can be inside a via 387 between levels 346 and 348.

The conductive segments described herein (e.g., 354, 355, 374, 376, 384, and 386) can include the same conductive material or different conductive materials. Example materials for these conductive segments can include conductive polysilicon, metals, metal alloys, or other conductive materials.

FIGS. 3B and 3C shows memory element 304 being located on level 343 of register file 302 as an example location. In alternative arrangements, memory element 304 can be located in a different location (e.g., in a different level) of register file 302.

In FIG. 3C, dimensions 367 and 368 can represent a footprint (in the X- and Y-directions) of memory cell 303 including transistors 311, 312, 313, and 314, and a portion of each of access lines 321, 323, 325, and 327, select line 330, and data lines 334, 336, and 338.

Dimension 367 can have a value based on a value of a line pitch (e.g., polyline pitch) 367a in the X-direction. As shown in FIG. 3C, line pitch 367a can include a value of the width of an access line (e.g., one of access lines 321, 323, 325, and 327) plus a distance from that access line to an adjacent access line (or an adjacent STI among STIs 391, 392, 393, and 394). In the example shown in FIG. 3C, dimension 367 can be approximately seven times (7×) the value of line pitch 367a. In some arrangements, line pitch 367a can have a value of approximately 70 nm. Thus, dimension 367 (which includes the footprint of transistors 311, 312, 313, and 314 in the X-direction, as shown in FIG. 3C) can be approximately 490 nm (7×70 nm) in some arrangements.

Dimension 368 can have a value based on a value of a line pitch (e.g., metal line pitch) 368a in the Y-direction. As shown in FIG. 3C, line pitch 368a can include a value of the width of a data line (e.g., one of data lines 336 and 338) plus a distance from one data line to an adjacent data line. In the example shown in FIG. 3C, dimension 368 can be approximately two (2×) times the value of line pitch 368a. In some arrangements, line pitch 368a can have a value of approximately 54 nm. Thus, dimension 368 (which includes the footprint of select line 330, and data lines 334, 336, and 338 in the Y-direction, as shown in FIG. 3C) can be approximately 108 nm (2×54 nm) in some arrangements.

Dimensions 367 and 368 (e.g., 490 nm×108 nm) associated with memory cell 303 of register file 302 described above may be relatively compact. This may allow register file 302 having a memory cell (e.g., memory cell 303) with multiple input/output ports (e.g., multiple read/write ports) that is suitable to be embedded in the same chip with other components (e.g., logic circuitry) of a processor, such as processor 100 of FIG. 1. The structures of register file 302 can be formed using a process (e.g., complementary metal-oxide semiconductor (CMOS) process) that may also be used to form other components of a processor, such as processor 100 of FIG. 1. Thus, the relative compactness and the process (e.g., CMOS process) of forming register file 302 may allow it be incorporated (e.g., embedded) in the same chip with other components (e.g., control block 101) of a processor, such as processor 100. This may improve operations of the processor (e.g., processor 100) including power management of the processor, as mentioned above with reference to FIG. 1.

Figure 3D:
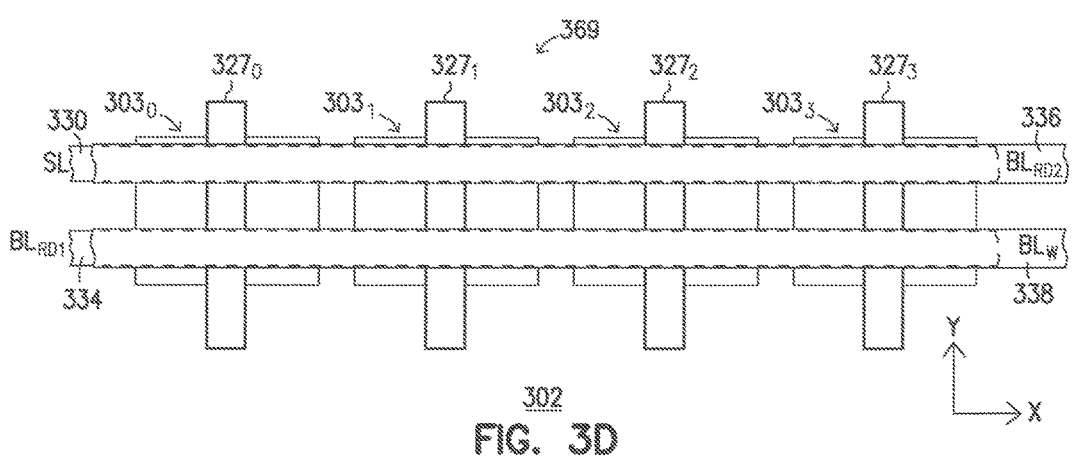
FIG. 3D shows a top view of a structure of a memory array of the register file of FIG. 3A, according to some embodiments described herein.

FIG. 3D shows a top view of a structure of a memory array 369 of register file 302, according to some embodiments described herein. Memory array 369 includes multiple memory cells $303_0$, $303_1$, $303_2$, and $303_3$. For simplicity, FIG. 3D shows memory array 369 having only four memory cells. The number of memory cells can vary. Each of memory cells $303_0$, $303_1$, $303_2$, and $303_3$ can include memory cell 303 described above with respect to FIG. 3A through FIG. 3C. As shown in FIG. 3D, select line 330 and data lines 334, 336, and 338 can extend across memory cells $303_0$, $303_1$, $303_2$, and $303_3$ in the X-direction, such that select line 330 and data lines 334, 336, and 338 can be shared by memory cells $303_0$, $303_1$, $303_2$, and $303_3$.

Register file 302 of FIG. 3D can include access lines (e.g., word lines) $327_0$, $327_1$, $327_2$, and $327_3$ (extending in the Y-direction). Each of access lines $327_0$, $327_1$, $327_2$, and $327_3$ can correspond to access line 327 of FIG. FIG. 3A through FIG. 3C. Register file 302 can use access lines $327_0$, $327_1$, $327_2$, and $327_3$ to selectively control transistors (not shown in FIG. 3D) in corresponding memory cells $303_0$, $303_1$, $303_2$, and $303_3$.

Figure 4:
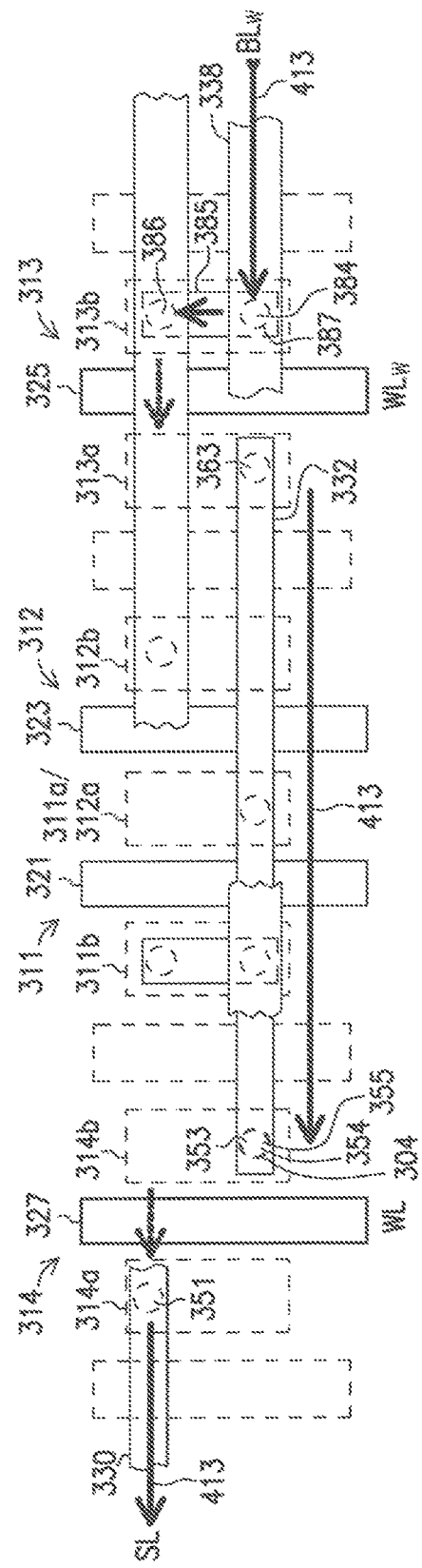
FIG. 4 shows a signal path during an operation (e.g., write operation) of storing information in the non-volatile memory cell of the register file of FIG. 3A through FIG. 3D, according to some embodiments described herein.

FIG. 4 shows a signal path 413 during a write operation to store information in memory cell 303 (FIG. 3A through FIG. 3C), according to some embodiments described herein. In a write operation, signal $WL_W$ on access line 325 and signal WL on access line 327 can be provided with voltages to turn on transistors 313 and 314. Signal $BL_W$ on data line 338 can be provided with a voltage (e.g., write voltage) and signal SL on select line 330 can be provided a voltage (e.g., write select voltage), such that a current can flow between data line 338 and select line 330 on signal path 413 through memory element 304.

As shown in FIG. 4, signal path 413 can include a signal path from data line 338 (e.g., entry point) to select line 330 (e.g., exit point). Thus, signal path 413 can go through data line 338, conductive segment 384 in via 387, line 385, conductive segment 386, drain 313b, source 313a (through a drain-to-source channel of transistor 313), connection 363, line 332, connection 353 (above memory element 304), memory element 304, conductive segments 354 and 355 (below memory element 304), drain 314b, source 314a (through a drain-to-source channel of transistor 314), connection 351, and select line 330.

FIG. 4 shows an example of signal path 413 entering data line 338 from the right of FIG. 4, such that signal path 413 goes from right to left of FIG. 4. However, signal path 413 can enter data line 338 from the left of FIG. 4, such that signal path 413 can enter and exit memory element 304 from the same side (e.g., from the left side of FIG. 4).

The structure of register file 302 may allow voltages of different polarities (e.g., a negative voltage and a positive voltage) to be applied to select line 330 and data line 338. For example, in a write operation associated with FIG. 4, a negative voltage (e.g., −Vdd) can be applied to select line 330 and a positive voltage (e.g., +Vdd) can be applied to data line 338, where Vdd can be the supply voltage (or can be based on the supply voltage) of register file 302.

Figure 5:
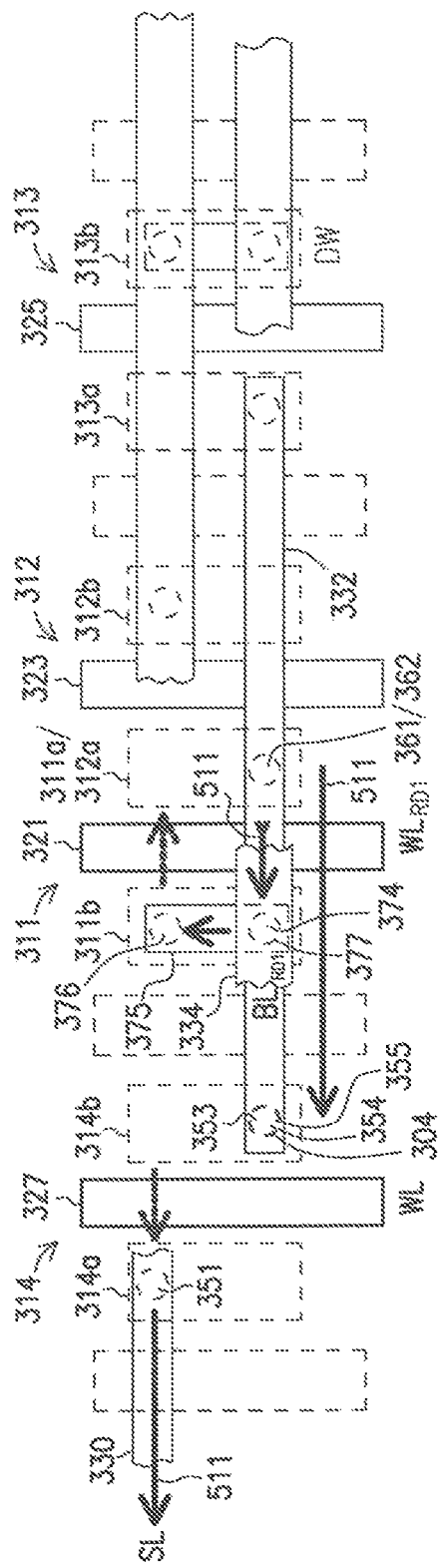
FIG. 5 shows a signal path during an operation (e.g., read operation) of retrieving information from the non-volatile memory cell of the register file of FIG. 3A through FIG. 3D, according to some embodiments described herein.

FIG. 5 shows a signal path 511 during a read operation associated with a read circuit coupled to data line 334 to retrieve information from memory cell 303 (FIG. 3A through FIG. 3C), according to some embodiments described herein. In a read operation associated with FIG. 5, signal $WL_{RD1}$ on access line 321 and signal WL on access line 327 can be provided with voltages to turn on transistors 311 and 314. Signal $BL_{RD1}$ on data line 334 can be provided with a voltage (e.g., read voltage) and signal SL on select line 330 can be provided a voltage (e.g., read select voltage), such that a current can flow between data line 334 and select line 330 on signal path 511 through memory element 304.

As shown in FIG. 5, signal path 511 can include a signal path from data line 334 (e.g., entry point) to select line 330 (e.g., exit point). Thus, signal path 511 can go through data line 334, conductive segment 374 in via 377, line 375, conductive segment 376, drain 311b, source 311a/312a (through a drain-to-source channel of transistor 311), connection 361/362, line 332, connection 353 (above memory element 304), memory element 304, conductive segments 354 and 355 (below memory element 304), drain 314b, source 314a (through a drain-to-source channel of transistor 314), connection 351, and select line 330.

FIG. 5 shows an example of signal path 511 entering data line 334 from the right of FIG. 5, such that signal path 511 goes from right to left of FIG. 5. However, signal path 511 can enter data line 334 from the left of FIG. 5, such that signal path 511 can enter and exit memory element 304 from the same side (e.g., from the left side of FIG. 5).

Figure 6:
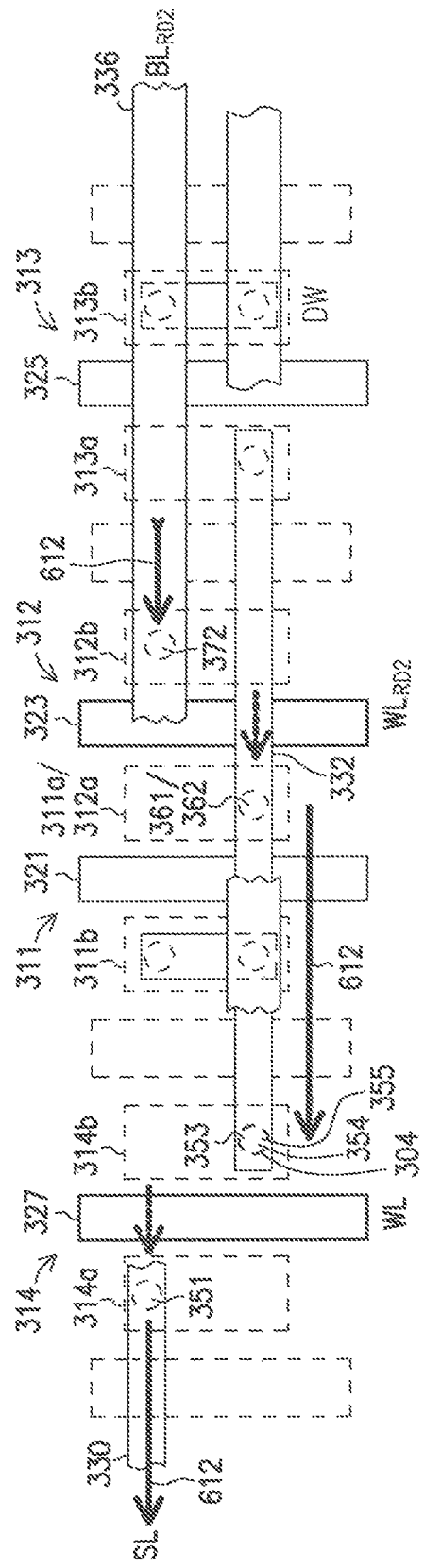
FIG. 6 shows another signal path during an operation (e.g., read operation) of retrieving information from the non-volatile memory cell of the register file of FIG. 3A through FIG. 3D, according to some embodiments described herein.

FIG. 6 shows a signal path 612 during a read operation associated with a read circuit coupled to data line 336, to retrieve information from memory cell 303 (FIG. 3A through FIG. 3C), according to some embodiments described herein. In a read operation associated with FIG. 6, signal $WL_{RD2}$ on access line 323 and signal WL on access line 327 can be provided with voltages to turn on transistors 312 and 314. Signal $BL_{RD2}$ on data line 336 can be provided with a voltage (e.g., read voltage) and signal SL on select line 330 can be provided a voltage (e.g., read select voltage), such that a current can flow between data line 336 and select line 330 on signal path 612 through memory element 304.

As shown in FIG. 6, signal path 612 can include a signal path from data line 336 (e.g., entry point) to select line 330 (e.g., exit point). Thus, signal path 612 can go through data line 336, conductive segment of connection 372, drain 312b, source 311a/312a (through a drain-to-source channel of transistor 312), connection 361/362, line 332, connection 353 (above memory element 304), memory element 304, conductive segments 354 and 355 (below memory element 304), drain 314b, source 314a (through a drain-to-source channel of transistor 314), connection 351, and select line 330.

FIG. 6 shows an example of signal path 612 entering data line 336 from the right of FIG. 6, such that signal path 612 goes from right to left of FIG. 6. However, signal path 612 can enter data line 336 from the left of FIG. 6, such that signal path 612 can enter and exit memory element 304 from the same side (e.g., from the left side of FIG. 6).

Figure 7:
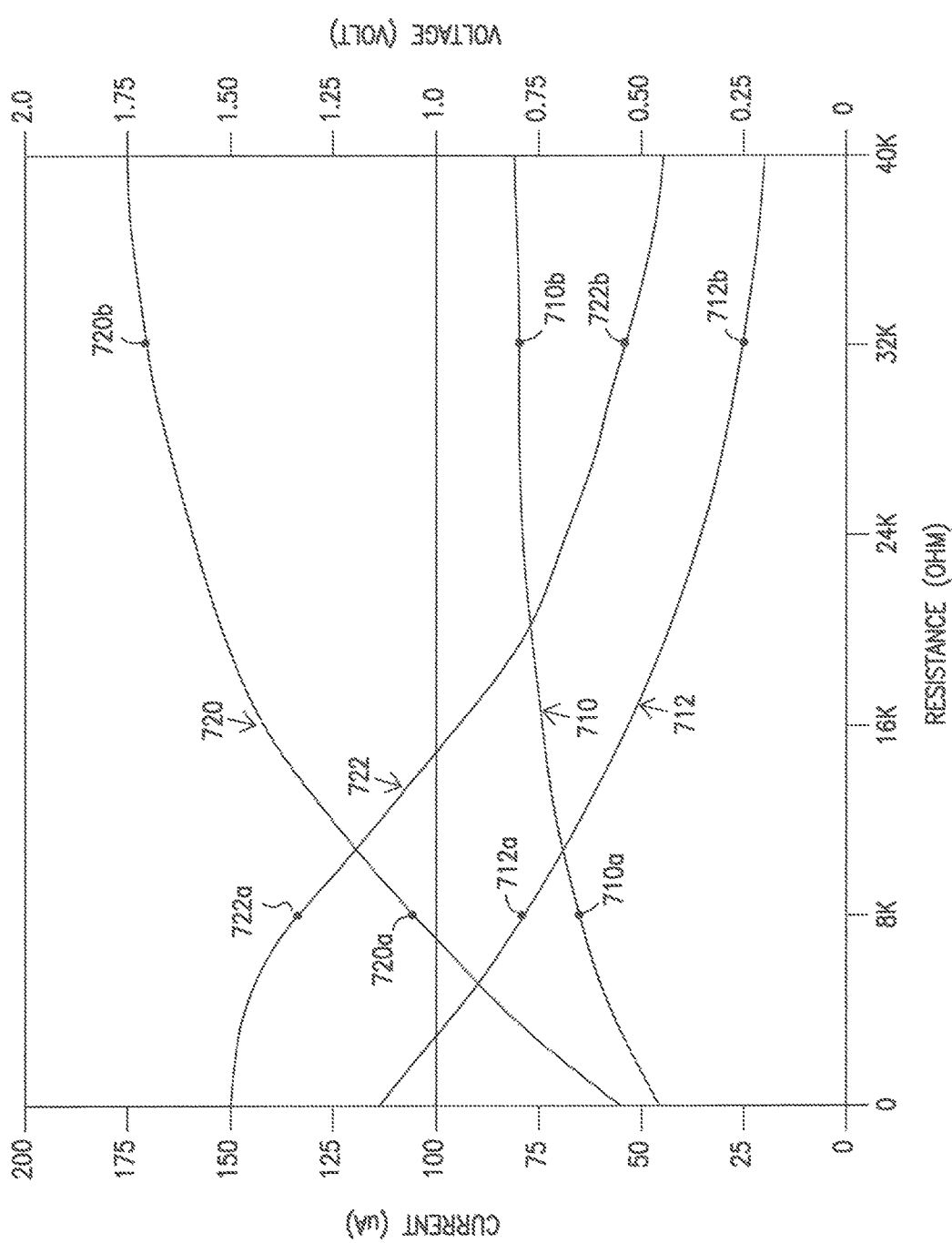
FIG. 7 is a graph showing an example simulation of operating conditions for a memory element of a register file, according to some embodiments described herein.

FIG. 7 is a graph showing an example simulation of operating conditions for a memory element of a register file, according to some embodiments described herein. The memory element associated with FIG. 7 can include memory element 204 of register file 202 (FIG. 2A through FIG. 2E) or memory element 304 of register file 302 (FIG. 3A through FIG. 3D).

FIG. 7 shows an example range of resistance of the memory element from 0 to 40K ohms. The memory element can be configured to have different conductive states based on the resistance of the memory element. For example, the memory element can be configured to be in one conductive state (e.g., more conductive) associated with a resistance of 8 Kohms (or approximately 8 Kohms) and in another conductive state (e.g., less conductive) associated with a resistance of 32K ohms (or approximately 32 Kohms).

Curve 710 and 712 show relationships among voltage and current, respectively, across the memory element and the resistance of the memory element in one operating condition. Curves 720 and 722 show relationships among voltage and current, respectively, across the memory element and resistance of the memory element in another operating condition.

As shown in FIG. 7, in one operating condition for a write operation, the voltage and current across the memory element can be approximately 0.6V (at point 710a) and approximately 80 μA (at point 712a), respectively, in which the resistance of the memory element can be 8K ohms. In this operating condition, the voltage and current across the memory element can also be approximately 0.8V (at point 710b) and approximately 25 μA (at point 712b), respectively, in which the resistance of the memory element can be 32K ohms. Thus, in this operating condition, the voltage across the memory element can be less than 1V.

In another operating condition for a write operation, the voltage and current across the memory element can be approximately 1.05V (at point 720a) and approximately 140 μA (at point 722a), respectively, in which the resistance of the memory element can be 8K ohms. In this operating condition, the voltage and current across the memory element can also be approximately 1.70V (at point 720b) and approximately 55 μA (at point 722b), respectively, in which the resistance of the memory element can be 32K ohms. Thus, in this operating condition, the voltage across the memory element can be greater than 1V and less than 2V.

Based on the on operating conditions described above, appropriate voltages (or currents) can be selected to operate the memory element in a write or read operation. For example, based on curves 710 and 712, appropriate voltages can be applied to select line 330 (FIG. 3A) and data line 338 (FIG. 3A) of register file 302 during a write operation, such that a voltage difference across memory element 304 can be 1V or less. This may cause memory element 304 to have a conductive state that reflects the value of information to be stored in memory element 304.

In another example, based on curves 720 and 722, appropriate voltages can be applied to select line 330 (FIG. 3A) and data line 338 (FIG. 3A) of register file 302 during a write operation, such that a voltage difference across memory element 304 can be between 1V and 2V. This may cause memory element 304 to have a conductive state that reflects the value of information to be stored in memory element 304. In this example, voltage of different polarities (e.g., a negative voltage and a positive voltage) can be applied to select line 330 and data line 338 of register file 302 (FIG. 3A). For example, a voltage of approximately −1V (e.g., −Vdd) can be applied to select line 330 and a voltage of approximately 1V (e.g., Vdd) can be applied to data line 338, where Vdd and −Vdd can be the supply voltage (or can be based on the supply voltage) of the register file.

Figure 8:
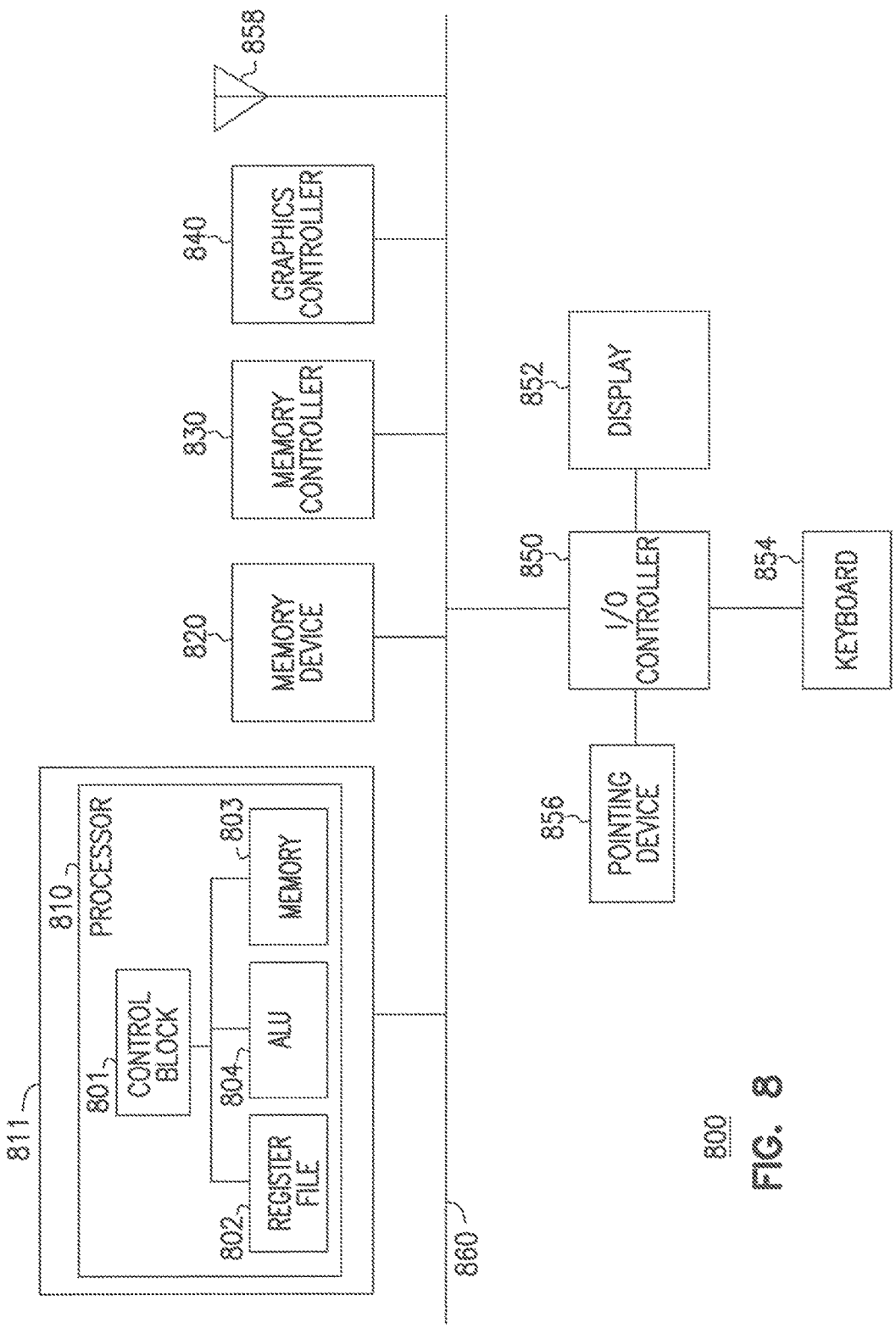
FIG. 8 shows an apparatus in the form of an electronic system, according to some embodiments described herein.

FIG. 8 shows an apparatus in the form of a system (e.g., electronic system) 800, according to some embodiments described herein. System 800 can include or be included in a computer (e.g., desktop or notebook computer), a tablet, a cellular telephone, and other electronic devices or systems. As shown in FIG. 8, system 800 can include a processor 810, a memory device 820, a memory controller 830, a graphics controller 840, an input and output (I/O) controller 850, a display 852, a keyboard 854, a pointing device 856, at least one antenna 858, and a bus 860.

Processor 810 may be a general-purpose processor or an application specific integrated circuit (ASIC). Processor 810 can correspond to processor 100 (FIG. 1). Processor 810 can include a control block 801, a register file 802, a memory 803, and an ALU 804. Control block 801 can include control block 101 (FIG. 1). Register file 802 can include a register file (e.g., register file 102, 202, or 302) and can perform its associated operations (e.g., write and read operations) described above with reference to FIG. 1 through FIG. 7.

Memory device 820 may be a DRAM device, an SRAM device, a flash memory device, or a combination of these memory devices. I/O controller 850 can include a communication module for wired or wireless communication (e.g., communication through one or more antennas 858). Display 852 can include a liquid crystal display (LCD), a touchscreen (e.g., capacitive or resistive touchscreen), or another type of display. Pointing device 856 can include a mouse, a stylus, or another type of pointing device.

As shown in FIG. 8, processor 810 can be located on (e.g., formed on or formed in) a die (e.g., semiconductor die) 811. Thus, control block 801, register file 802, memory 803, and ALU 804 can be located on the same die (such as die 811). In an alternative arrangement, memory 803 can be located outside processor 810 (e.g., outside die 811). For example, memory 803 can be part of memory device 820 formed on a die separated from die 811.

FIG. 8 shows the components of system 800 arranged separated from each other as an example. In some arrangements, two or more components of system 800 can be located on the same die (e.g., same chip) that forms a system-on-chip (SoC).

Figure 9:
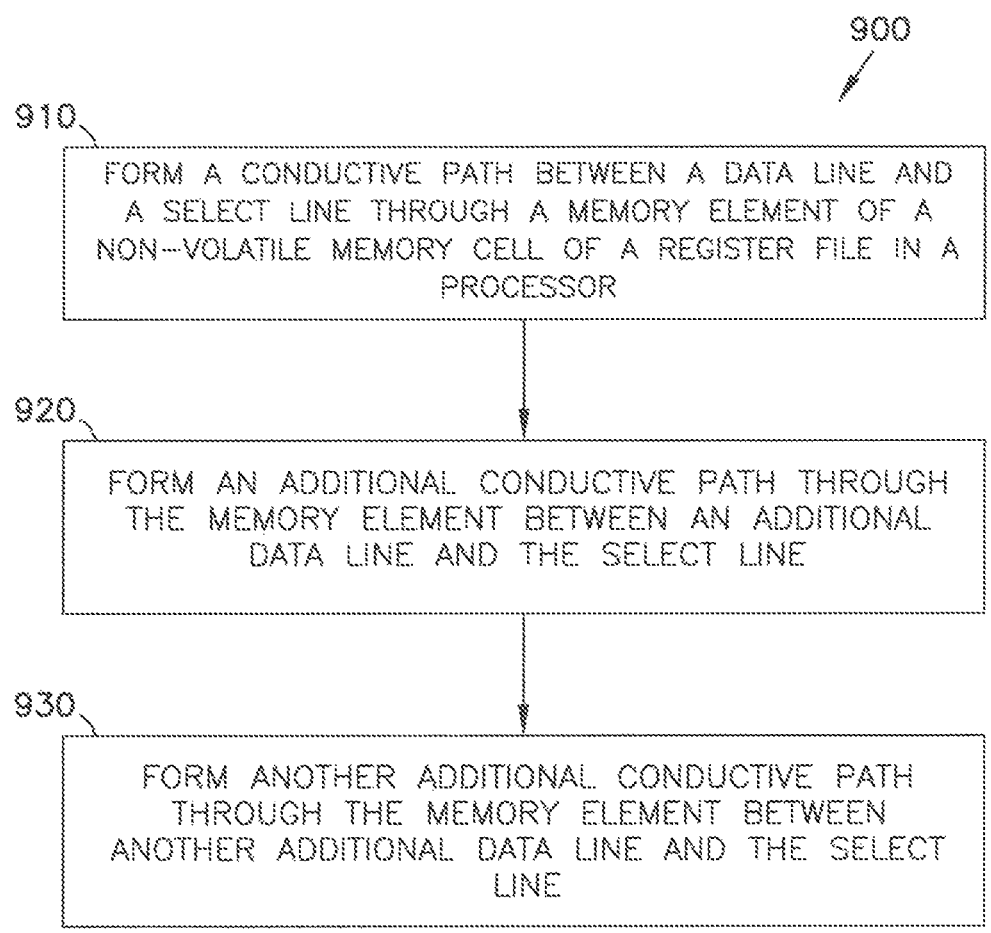
FIG. 9 is flowchart showing a method of operating a register file, according to some embodiments described herein.

FIG. 9 is a flow diagram for a method 900 of operating a register file, according some embodiments described herein. The register file used in method 900 can include register file 102, 202, 302, or 802, described above with reference to FIG. 1 through FIG. 8.

As shown in FIG. 9, activity 910 of method 900 can include forming a conductive path between a data line and a select line through a memory element of a non-volatile memory cell of a register file in a processor. Activity 910 can be performed during a write operation of the register file to store information in the memory element. Activity 920 can include forming an additional conductive path through the memory element between an additional data line and the select line. Activity 920 can be performed during a read operation of the register file to retrieve information from the memory element. Activity 930 can include forming another additional conductive path through the memory element between another additional data line and the select line. Activity 930 can be performed during a read operation of the register file to retrieve information from the memory element. Activity 910 and activity 920 may be performed at different times. Activity 910 and activity 930 may be performed at different times. Activities 920 and 930 can be either performed at different times or performed concurrently. Activities 910, 920, and 930 may not have to be performed in the order shown in FIG. 9.

Method 900 can include fewer or more activities relative to activities 910, 920, and 930 shown in FIG. 9. For example, method 900 can include activities and operations (e.g., write and read operations) described above with reference to FIG. 1 through FIG. 8.

The illustrations of the apparatuses (e.g., processor 100 and system 800) and methods (e.g., method 900 and operations of processor 100, register files 102, 202, 302, and 802, and system 800) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

Additional Notes and Examples

Example 1 includes subject matter (such as a device circuit apparatus or electronic system apparatus, or machine) including a memory element included in a non-volatile memory cell, the memory element including a conductive oxide material located over a substrate, a transistor including a drain coupled to a first portion of the memory element, an access line coupled to a gate to the transistor, the access line having a length extending in a first direction and located between the substrate and the memory element, a first conductive line coupled to a source of the transistor, the first conductive line having a length extending in a second direction and located between the access line and the memory element, and a second conductive line coupled to a second portion of the memory element, the second conductive line having a length extending in the second direction, wherein the memory element is located between the first and second conductive lines.

In Example 2, the subject matter of Example 1 may optionally include, wherein the first conductive line is located on a first level of the apparatus, the second conductive line is located on a second level of the apparatus, at least a portion of the memory element is inside a via, and the via is located on a level between the first and second levels.

In Example 3, the subject matter of Example 1 may optionally include, wherein the non-volatile memory cell is included in a register file, and the transistor is arranged to form part of a conductive path between the first and second conductive lines during a write operation of the register file.

In Example 4, the subject matter of Example 1 may optionally include, wherein the non-volatile memory cell is included in a register file, and the transistor is arranged to form part of a conductive path between the first and second conductive lines during a read operation of the register file.

In Example 5, the subject matter of Example 1 may optionally include, a first additional transistor coupled in series with the memory element between the second conductive line and a first data line, a second additional transistor coupled in series with the memory element between the second conductive line and a second data line, and a third additional transistor coupled in series with the memory element between the second conductive line and a third data line.

In Example 6, the subject matter of Example 5 may optionally include, wherein the memory element, the transistor, and the first, second, and third additional transistors are arranged to allow the non-volatile memory cell to operate as a non-volatile memory cell having multiple input/output ports.

Example 7 includes subject matter (such as a device, circuit apparatus or electronic system apparatus, or machine) including a control block included in a processor, the control block located on a semiconductor die, a register file included in the processor, the register file located on the semiconductor die, the register file including a memory array, the memory array including a non-volatile memory cell, the non-volatile memory cell including a memory element, the memory element including a conductive oxide material arranged to store information, a transistor coupled to the memory element and arranged to operate during an operation of storing information in the memory element and during an operation of retrieving information from the memory element, and at least one additional transistor coupled to the memory element and arranged to operate during at least one of the operation of storing information in the memory element and the operation of retrieving information from the memory element.

In Example 8, the subject matter of any one of Example 7 may optionally include, wherein the memory element, the transistor, and the at least one additional transistor are arranged to allow the non-volatile memory cell of the register file to operate as a non-volatile memory cell having multiple write/read ports.

In Example 9, the subject matter of any one of Example 7 may optionally include, wherein the at least one additional transistor includes a first additional transistor coupled to the memory element and a first data line, a second additional transistor coupled to the memory element and a second data line, and a third additional transistor coupled to the memory element and a third data line, wherein the first and second data lines are located on different levels of the apparatus, and the second and third data lines located on a same level of apparatus.

In Example 10, the subject matter of Example 9 may optionally include a select line coupled to the transistor, wherein the select line and the first data line are located on different levels of apparatus.

In Example 11, the subject matter of Example 10 may optionally include, wherein the select line and each of the first, second, and third data lines have lengths extending in a same direction.

In Example 12, the subject matter of Example 11 may optionally include, wherein access lines, wherein each of the access lines is coupled to a gate of one of the transistor, the first additional transistor, the second additional transistor, and the third additional transistor, and the access lines have lengths extending in a direction different from the direction of the lengths of the select line and each of the first, second, and third data lines.

In Example 13, the subject matter of Example 7 may optionally include, wherein the at least one additional transistor includes a first transistor arranged to operate in the operation of storing information in the memory element, and a second transistor and a third transistor arranged to operate in the operation of retrieving information from the memory element, and wherein the transistor and the first, second, and third transistors have a footprint, the footprint having a dimension of approximately seven times a line pitch of one of the access lines.

In Example 14, the subject matter of Example 13 may optionally include, wherein the footprint has another dimension of approximately two times a line pitch of one of the second and third data lines.

In Example 15, the subject matter of Example 7 may optionally include a select line coupled to the transistor, and a data line coupled to the at least one additional transistor, wherein the select and data lines are arranged to receive voltages of opposite polarities during the operation of storing information in the memory element.

In Example 16, the subject matter of Example 15 may optionally include, wherein the select line is arranged to receive a negative voltage during the operation of storing information in the memory element, and the data line is arranged to receive a positive voltage during the operation of storing information in the memory element.

In Example 17, the subject matter of Example 7 may optionally include, wherein the apparatus comprises an electronic system, the electronic system including an antenna.

Example 18 includes subject matter including a method of operating a register file, the method comprising forming a first conductive path between a first data line and a select line through a memory element of a non-volatile memory cell of a register file of a processor during a write operation of the register file, and forming at least one of a second conductive path through the memory element between a second data line and the select line and a third conductive path through the memory element between a third data line and the select line during a read operation of the register file.

In Example 19, the subject matter of Example 18 may optionally include, wherein forming the at least one of the second conductive path and the third conductive path includes forming the second conductive path concurrently with forming the third conductive path.

In Example 20, the subject matter of Example 18 may optionally include, wherein forming the first conductive path includes turning on a select transistor and a first transistor, and the select transistor and the first transistor are coupled in series with the memory element between the first data line and the select line.

In Example 21, the subject matter of Example 20 may optionally include, wherein forming the second conductive path includes turning on the select transistor and a second transistor, and the select transistor and the second transistor are coupled in series with the memory element between the second data line and the select line.

In Example 22, the subject matter of Example 21 may optionally include, wherein forming the third conductive path includes turning on the select transistor and a third transistor, and the select transistor and the third transistor are coupled in series with the memory element between the third data line and the select line.

The subject matter of Example 1 through Example 22 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   a control block included in a processor, the control block located on a semiconductor die;
   a register file included in the processor, the register file located on the semiconductor die, the register file including a memory array, the memory array including a non-volatile memory cell, the non-volatile memory cell including a memory element, the memory element including a conductive oxide material arranged to store information;
   a transistor coupled to the memory element and arranged to operate during an operation of storing information in the memory element and during an operation of retrieving information from the memory element; and
   at least one additional transistor coupled to the memory element and arranged to operate during at least one of the operation of storing information in the memory element and the operation of retrieving information from the memory element.

2. The apparatus of claim 1, wherein the memory element, the transistor, and the at least one additional transistor are arranged to allow the non-volatile memory cell of the register file to operate as a non-volatile memory cell having multiple write/read ports.

3. The apparatus of claim 1, wherein the at least one additional transistor includes:

a first additional transistor coupled to the memory element and a first data line;

a second additional transistor coupled to the memory element and a second data line; and a third additional transistor coupled to the memory element and a third data line, wherein the first and second data lines are located on different levels of the apparatus, and the second and third data lines located on a same level of apparatus.

4. The apparatus of claim 3, further comprising a select line coupled to the transistor, wherein the select line and the first data line are located on different levels of apparatus.

5. The apparatus of claim 4, wherein the select line and each of the first, second, and third data lines have lengths extending in a same direction.

6. The apparatus of claim 5, further comprising access lines, wherein each of the access lines is coupled to a gate of one of the transistor, the first additional transistor, the second additional transistor, and the third additional transistor, and the access lines have lengths extending in a direction different from the direction of the lengths of the select line and each of the first, second, and third data lines.

7. The apparatus of claim 1, wherein the at least one additional transistor includes a first transistor arranged to operate in the operation of storing information in the memory element, and a second transistor and a third transistor arranged to operate in the operation of retrieving information from the memory element, and wherein the transistor and the first, second, and third transistors have a footprint, the footprint having a dimension of approximately seven times a line pitch of one of the access lines.

8. The apparatus of claim 7, wherein the footprint has another dimension of approximately two times a line pitch of one of the second and third data lines.

9. The apparatus of claim 1, further comprising a select line coupled to the transistor, and a data line coupled to the at least one additional transistor, wherein the select and data lines are arranged to receive voltages of opposite polarities during the operation of storing information in the memory element.

10. The apparatus of claim 9, wherein the select line is arranged to receive a negative voltage
during the operation of storing information in the memory element, and the data line is arranged to receive a positive voltage during the operation of storing information in the memory element.

11. An apparatus comprising:
an antenna; and
a processor coupled to the antenna, the processor including:
a control block;
a register file coupled to the control block, the register file including a memory array, the memory array including a non-volatile memory cell, the non-volatile memory cell including a memory element, the memory element including a conductive oxide material arranged to store information;

a transistor coupled to the memory element and arranged to operate during an operation of storing information in the memory element and during an operation of retrieving information from the memory element; and at least one additional transistor coupled to the memory element and arranged to operate during at least one of the operation of storing information in the memory element and the operation of retrieving information from the memory element.

12. The apparatus of claim 11, wherein the memory element, the transistor, and the at least one additional transistor are arranged to allow the non-volatile memory cell of the register file to operate as a non-volatile memory cell having multiple write/read ports.

13. The apparatus of claim 11, wherein the processor includes an arithmetic logic unit coupled to the control block.

14. The apparatus of claim 12, wherein the processor includes a memory coupled to the file register.

15. The apparatus of claim 14, further comprising a memory device coupled to the processor.

16. A method comprising:
forming a first conductive path between a first data line and a select line through a memory element of a non-volatile memory cell of a register file of a processor during a write operation of the register file; and forming at least one of a second conductive path through the memory element between a second data line and the select line and a third conductive path through the memory element between a third data line and the select line during a read operation of the register file.

17. The method of claim 16, wherein forming the at least one of the second conductive path and the third conductive path includes forming the second conductive path concurrently with forming the third conductive path.

18. The method of claim 16, wherein forming the first conductive path includes turning on a select transistor and a first transistor, and the select transistor and the first transistor are coupled in series with the memory element between the first data line and the select line.

19. The method of claim 18, wherein forming the second conductive path includes turning on the select transistor and a second transistor, and the select transistor and the second transistor are coupled in series with the memory element between the second data line and the select line.

20. The method of claim 19, wherein forming the third conductive path includes turning on the select transistor and a third transistor, and the select transistor and the third transistor are coupled in series with the memory element between the third data line and the select line.

* * * * *